United States Patent
Kimura et al.

(10) Patent No.: US 9,869,808 B2
(45) Date of Patent: Jan. 16, 2018

(54) PLANAR LIGHT-EMITTING UNIT

(71) Applicant: Konica Minolta, Inc., Tokyo (JP)

(72) Inventors: Naoki Kimura, Takatsuki (JP); Yusuke Hirao, Takatsuki (JP); Koujirou Sekine, Ibaraki (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/305,264

(22) PCT Filed: Mar. 17, 2015

(86) PCT No.: PCT/JP2015/057851
§ 371 (c)(1),
(2) Date: Oct. 19, 2016

(87) PCT Pub. No.: WO2015/163041
PCT Pub. Date: Oct. 29, 2015

(65) Prior Publication Data
US 2017/0123137 A1 May 4, 2017

(30) Foreign Application Priority Data

Apr. 21, 2014 (JP) ................................. 2014-087295

(51) Int. Cl.
*F21V 8/00* (2006.01)
*H01L 51/52* (2006.01)
(Continued)

(52) U.S. Cl.
CPC ......... *G02B 6/0051* (2013.01); *G02B 6/0068* (2013.01); *H01L 25/048* (2013.01);
(Continued)

(58) Field of Classification Search
CPC . G02B 6/0051; G02B 6/0068; H01L 51/5246; H01L 51/5281; H01L 25/048;
(Continued)

(56) References Cited

FOREIGN PATENT DOCUMENTS

| JP | 2005158369 A | 6/2005 |
|----|--------------|--------|
| JP | 2005353564 A | 12/2005 |

(Continued)

OTHER PUBLICATIONS

International Search Report dated Jun. 23, 2015 for PCT/JP2015/057851.

*Primary Examiner* — Joseph L. Williams
(74) *Attorney, Agent, or Firm* — Lucas & Mercanti, LLP

(57) ABSTRACT

A planar light-emitting unit includes a light emission region and a non-light emission region located in an outer periphery of the light emission region. A non-space region is provided between a light guide member and a diffusion member in a region corresponding to the non-light emission region such that a space is formed in a region corresponding to the light emission region between the light guide member and the diffusion member. The non-space region includes a protruding region extending to the light emission region from the non-light emission region, and a conditional expression $0 < \Delta \leq 2d \times \tan\theta$ is fulfilled, where $\Delta$ is a protruding amount (mm) from the non-light emission region of the non-space region, d is a thickness (mm) of the light guide member, and $\theta$ is a total reflection critical angle between the light guide member and air.

20 Claims, 6 Drawing Sheets

(51) Int. Cl.
    *H01L 51/50*     (2006.01)
    *H01L 51/00*     (2006.01)
    *H01L 25/04*     (2014.01)

(52) U.S. Cl.
    CPC ...... *H01L 51/0097* (2013.01); *H01L 51/5012* (2013.01); *H01L 51/5206* (2013.01); *H01L 51/5221* (2013.01); *H01L 51/5246* (2013.01); *H01L 51/5281* (2013.01); *H01L 2251/533* (2013.01); *H01L 2251/5338* (2013.01)

(58) Field of Classification Search
    CPC ............... H01L 51/097; H01L 51/5221; H01L 51/5012; H01L 51/5206
    See application file for complete search history.

(56) References Cited

FOREIGN PATENT DOCUMENTS

| | | |
|---|---|---|
| JP | 2009048943 A | 3/2009 |
| JP | 2013258103 A | 12/2013 |
| JP | 2014053243 A1 | 3/2014 |
| JP | 2014170651 A | 9/2014 |
| WO | 2009081838 A1 | 7/2009 |
| WO | 2015033846 A1 | 3/2015 |
| WO | 2015079912 A1 | 6/2015 | a ----- ONLY TILING OF PLANAR LIGHT EMITTING PANELS
b ——— TILING OF PLANAR LIGHT EMITTING PANELS
        +SHADING BY DIFFUSION MEMBER c ——— EXTRACTING LIGHT ONLY FROM
      NON-LIGHT EMISSION REGION R2

FIG. 15
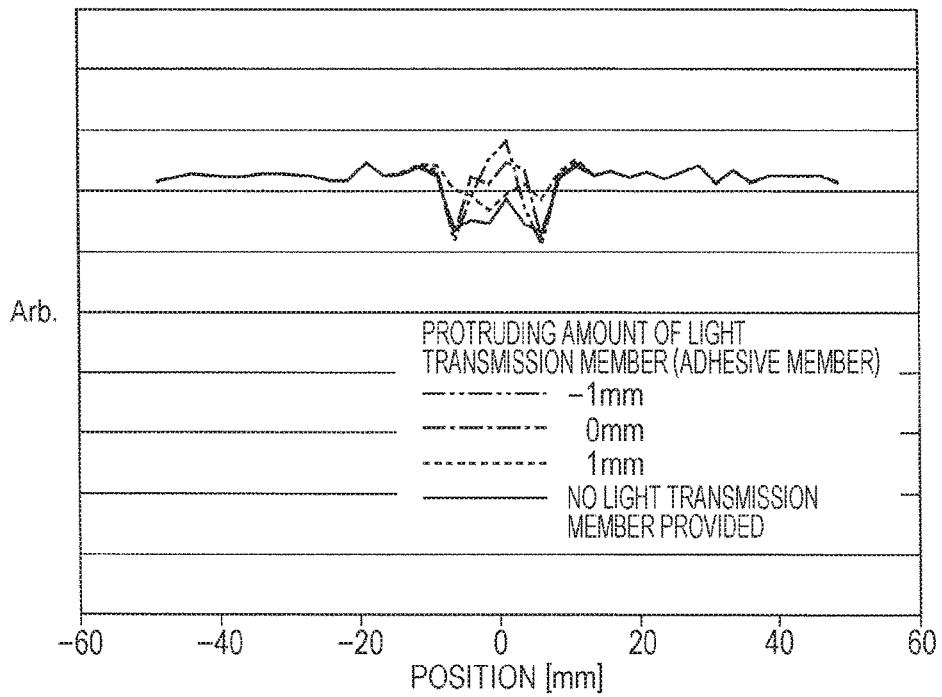
FIG. 16
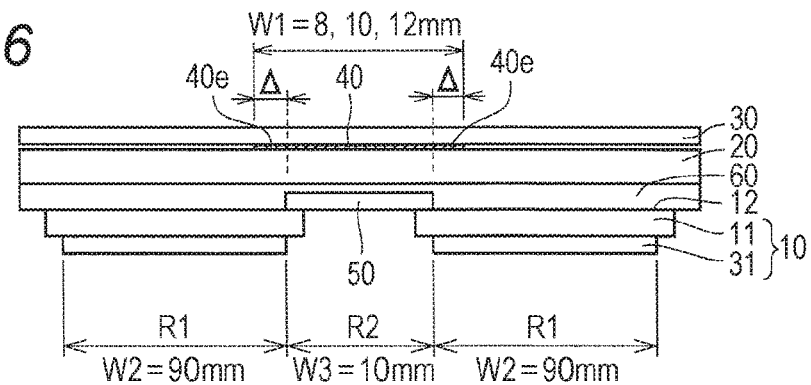
FIG. 17
| PROTRUDING AMOUNT Δ [mm] | 0 | 5 | 7 | 9 |
|---|---|---|---|---|
| EVALUATION ON PLANAR LIGHT EMITTING UNIT SAMPLE OF ACTUAL MACHINE | B | A | A | C |
A: LARGE IMPROVEMENT OBSERVED
B: IMPROVEMENT OBSERVED
C: NO CHANGE

PLANAR LIGHT-EMITTING UNIT

CROSS REFERENCE TO RELATED APPLICATION

This Application is a 371 of PCT/JP2015/057851 filed on Mar. 17, 2015 which, in turn, claimed the priority of Japanese Application No. 2014-087295 filed on Apr. 21, 2014, both applications are incorporated herein by reference.

TECHNICAL FIELD

The present invention relates to a planar light-emitting unit using a plurality of planar light-emitting portions.

BACKGROUND ART

In a structure forming a larger light emitting device by arranging a plurality of planar light-emitting panels using organic electroluminescence (EL) and the like, a non-light emission region existing in a periphery of a light source of plane light emission is dark. Therefore, a luminance difference is generated between a light-emitting portion and the non-light emission region. Therefore, a problem to be solved is how to obtain a uniform light-emitting surface without having any unevenness by making a luminance on a non-light-emitting portion at a joint between a planar light-emitting panel and a planar light-emitting panel approximate to a luminance on a light-emitting portion.

As a related art, a configuration of reducing a luminance difference by providing a diffusion member on a light source at a predetermined distance space is disclosed in JP 2005-353564 A (Patent Literature 1). Additionally, a configuration of reducing a luminance difference by disposing light guide member 20 on a light source and performing light extraction only from a non-light emission region by embedding diffusion particles only on the non-light emission region inside the light guide member 20 is disclosed in JP 2005-158369 A (Patent Literature 2).

CITATION LIST

Patent Literatures

Patent Literature 1: JP 2005-353564 A
Patent Literature 2: JP 2005-158369 A

SUMMARY OF INVENTION

Technical Problem

However, according to configurations disclosed in above Patent Literatures, a predetermined interval is needed to be secured between a light-emitting surface and a diffusion member, and particularly in a light source characterized in thinness of an organic EL light emitting element and the like, the configuration of providing the diffusion member at a distance space may increase a thickness of an entire planar light-emitting unit and result in loosing such a characteristic of thinness.

Therefore, the present invention has been made in view of the above-described problems, and an object thereof is to provide a planar light-emitting unit having a structure in which luminance unevenness is made inconspicuous in the planar light-emitting unit without causing increase of a thickness of the planar light-emitting unit.

Solution to Problem

A planar light emitting element according to an embodiment includes: a plurality of surface light-emitting portions obtained by arraying light-emitting surfaces so as to be aligned in a plane shape, and adapted to emit light toward a visible side; a light guide member arranged in a manner facing the light-emitting surfaces of the plurality of surface light-emitting portions adjacent to each other and adapted to transmit light emitted from the surface light-emitting portions; and a diffusion member provided on an opposite side of the surface light-emitting portions interposing the light guide member and adapted to diffuse, toward a visible side, the light having passed through the light guide member.

Each of the plurality of surface light-emitting portions includes a light emission region adapted to emit light and a non-light emission region located on an outer periphery of the light emission region and adapted not to emit light. A non-space region not formed with a space between the light guide member and the diffusion member is provided in a region corresponding to the non-light emission region such that a space is formed in a region corresponding to the light emission region between the light guide member and the diffusion member, and the non-space region includes a protruding region extending to the light emission region from the non-light emission region, and in the case of defining, as Δ, a protruding amount from the non-light emission region, a following conditional expression (1) is fulfilled.

$$0 < \Delta \leq 2d \times \tan\theta \quad (1)$$

Δ is the protruding amount from the non-light emission region of the non-space region described above, d is a thickness of the light guide member (mm), and θ is a total reflection critical angle between the light guide member and air.

Advantageous Effects of Invention

According to this planar light-emitting unit, the object is to provide a planar light-emitting unit having a structure in which luminance unevenness in the planar light-emitting unit can be made inconspicuous without causing increase of a thickness of the planar light-emitting unit.

BRIEF DESCRIPTION OF DRAWINGS

FIG. 15 is a diagram illustrating a relation between a width position and an optional unit (arb) in the case of varying a width (adhering width) of a light transmission member of the planar light-emitting unit in the example.

FIG. 16 is a cross-sectional view illustrating a structure of a planar light-emitting unit sample in the example.

FIG. 17 is a cross-sectional diagram illustrating an evaluation result of the planar light-emitting unit sample in the example.

DESCRIPTION OF EMBODIMENTS

A planar light-emitting units according to each of embodiments based on the present invention will be described below with reference to the drawings. When reference is made to a number, an amount and the like in the embodiments described below, the scope of the present invention is not necessarily limited to the number, the amount, and the like, unless otherwise specified. Same components or equivalent components are indicated by same reference numbers, and the same description may not be repeated. It is originally intended to use configurations of the respective embodiments by suitable combination.

First Embodiment: Planar Light-Emitting Panel 10

Figure 1:
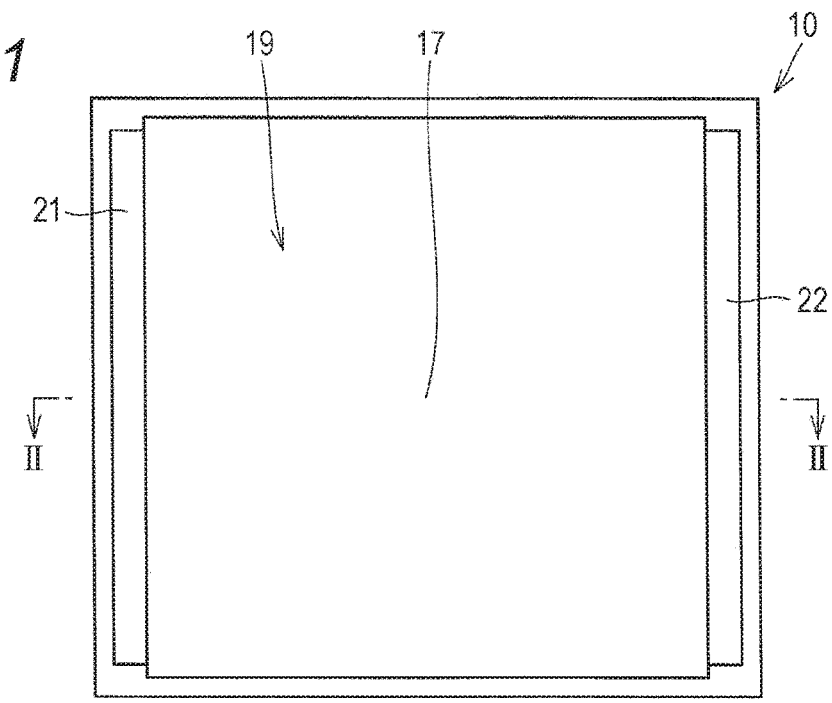
FIG. 1 is a plan view illustrating a basic structure of a planar light-emitting panel according to a first embodiment.
Figure 2:
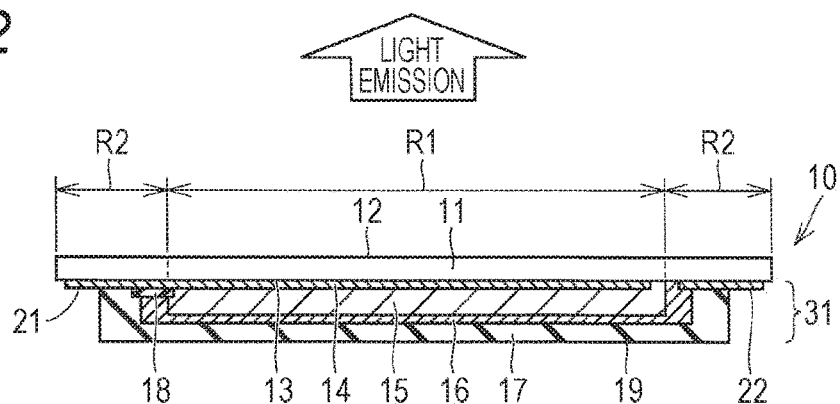
FIG. 2 is a cross-sectional view taken along an arrow line II-II in FIG. 1.

A basic structure of a planar light-emitting panel 10 according to the present embodiment will be described with reference to FIGS. 1 and 2. FIG. 1 is a front view of the planar light-emitting panel 10 and illustrates a state at the time of viewing the planar light-emitting panel 10 from a side of a back surface 19 of the planar light-emitting panel 10. FIG. 2 is a cross-sectional view taken along an arrow line II-II in FIG. 1.

The planar light-emitting panel 10 according to the present embodiment is formed of an organic EL, and formed flexible such that the entire planar light-emitting panel can be curved. The planar light-emitting panel 10 may also be formed as a planar light-emitting panel made of a plurality of light emitting diodes (LEDs) and a diffusion plate or may also be formed as a planar light-emitting panel using a cold cathode tube and the like.

Furthermore, the planar light-emitting panel 10 according to the present embodiment is a bottom emission type, but other devices may also be used as far as it is a planer light emitting light source. For example, a top emission type planar light-emitting panel may also be used, and an organic EL or a planar light emitting light source formed by an LED and a light guide plate may also be used. Moreover, as far as a planar light source is adopted, a light source having flexibility may also be used.

Referring to FIGS. 1 and 2, the planar light-emitting panel 10 includes a transparent substrate 11 (cover layer), a positive pole (anode) 14, an organic layer 15, a negative pole (cathode) 16, a sealing member 17, and an insulation layer 18. A planar light-emitting portion 31 is formed of the positive pole 14, organic layer 15, negative pole 16, and sealing member 17.

The transparent substrate 11 constitutes a light-emitting surface 12 (front surface) of the planar light-emitting panel 10. The positive pole 14, organic layer 15, and negative pole 16 are sequentially stacked on a rear surface 13 of the transparent substrate 11. The sealing member 17 forms the back surface 19 of the planar light-emitting panel 10.

As a member constituting the transparent substrate 11, a transparent member having flexibility is used. As a material, a light transmissive film substrate such as polyethylene terephthalate (PET) or polycarbonate (PC) is used. Various kinds of glass substrates may also be used for the transparent substrate 11.

As other examples of the light transmissive film substrate, polyimide, polyethylene naphthalate (PEN), polystyrene (PS), polyethersulfone (PES), polypropylene (PP), and the like may be used.

The positive pole 14 is a conductive film having transparency. In order to form the positive pole 14, indium tin oxide (ITO) is formed as a film on the transparent substrate 11 by a sputtering method or the like. As other materials used for the positive pole 14, polyethylene dioxythiophene (PEDOT) is used.

The organic layer 15 (light-emitting portion) can generate light (visible light) by being supplied with power. The organic layer 15 may be formed of a single light-emitting layer, and may also be formed by sequentially stacking a hole transporting layer, a light-emitting layer, a hole blocking layer, an electron transporting layer, and the like.

The negative pole 16 is, for example, aluminum (Al). The negative pole 16 is formed by a vacuum deposition method or the like in a manner covering the organic layer 15. At the time of vacuum deposition, preferably, a mask is used in order to pattern the negative pole 16 into a predetermined shape. As other materials of the negative pole 16, a layer stack of lithium fluoride (LiF), Al, and Ca, a layer stack of Al and LiF, a layer stack of Al and Ba, and the like are used.

An insulation layer 18 is provided between the negative pole 16 and the positive pole 14 so as to avoid short-circuit between the negative pole 16 and the positive pole 14. For example, after forming a film of $SiO_2$ or the like by a sputtering method, the insulation layer 18 is formed in a predetermined pattern by using photolithography or the like so as to cover a place where the positive pole 14 and the negative pole 16 are insulated from each other.

The sealing member 17 is formed of a resin having an insulation property or a glass substrate. The sealing member 17 is formed in order to protect the organic layer 15 from water content and the like. The sealing member 17 seals substantially all of the positive pole 14, organic layer 15, and negative pole 16 (members provided inside the planar light-emitting panel 10) on the transparent substrate 11. A part of the positive pole 14 is exposed from the sealing member 17 for electrical connection.

For the sealing member 17, a material having a gas barrier property may be used by multiply stacking layers of inorganic films of $SiO_2$, $Al_2O_3$, $SiNx$, and the like, an acrylic resin film having flexibility, and the like on the film of PET, PEN, PS, PES, polyimide, and the like. For an electrode portion 21 and an electrode portion 22, gold, silver, copper, and the like may be further stacked.

The portion exposed from the sealing member 17 of the positive pole 14 (left side in FIG. 2) constitutes the electrode portion 21 (for positive pole). The electrode portion 21 and the positive pole 14 are mutually formed of the same material. The electrode portion 21 is located on an outer periphery on one side surface of the planar light-emitting panel 10. The portion exposed from the sealing member 17 of the negative pole 16 (right side in FIG. 2) constitutes the electrode portion 22 (for negative pole). The electrode portion 22 and the negative pole 16 are mutually formed of the same material. The electrode portion 22 is also located on the outer periphery on the other side of the planar light-emitting panel 10.

The electrode portion 21 and the electrode portion 22 are located on the sides opposing to each other, interposing the organic layer 15. Wiring patterns (not illustrated) are attached to the electrode portion 21 and the electrode portion 22 by soldering (silver paste) or the like.

In the organic layer 15 of the planar light-emitting panel 10 structured as described above, power is supplied from an external power supply unit via the wiring patterns not illustrated, electrode portions 21, 22, positive pole 14, and negative pole 16. Light generated at the organic layer 15 is extracted to the outside from the light-emitting surface 12 (front surface) via the positive pole 14 via the transparent substrate 11.

In the planar light-emitting panel 10, since the light is emitted from the organic layer 15, a position corresponding to the organic layer 15 constitutes a light emission region R1, and an external region surrounding the organic layer 15 constitutes a non-light emission region R2. Therefore, in the case of arraying the planar light-emitting panels 10 so as to be aligned in a plane shape as described later, the non-light emission region R2 is formed of a gap formed between adjacent planar light-emitting panels 10 and the external region surrounding the organic layer 15.

(Planar Light-Emitting Unit 100)

Figure 3:
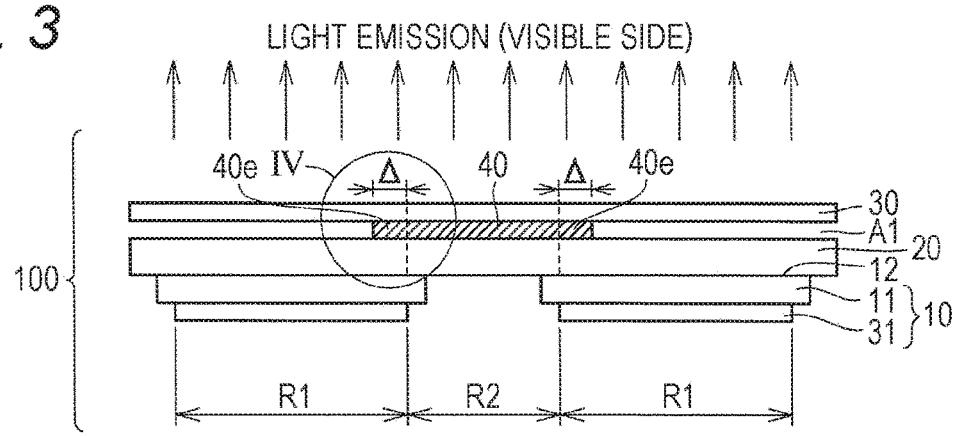
FIG. 3 is a cross-sectional view illustrating a structure of a planar light-emitting unit according to the first embodiment.
Figure 4:
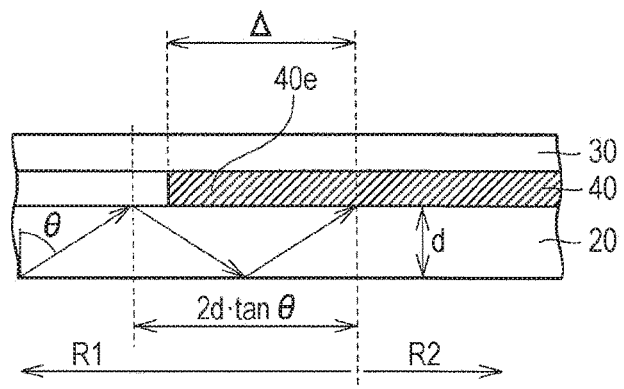
FIG. 4 is an enlarged view of a region surrounded by IV in FIG. 3.
Figure 5:
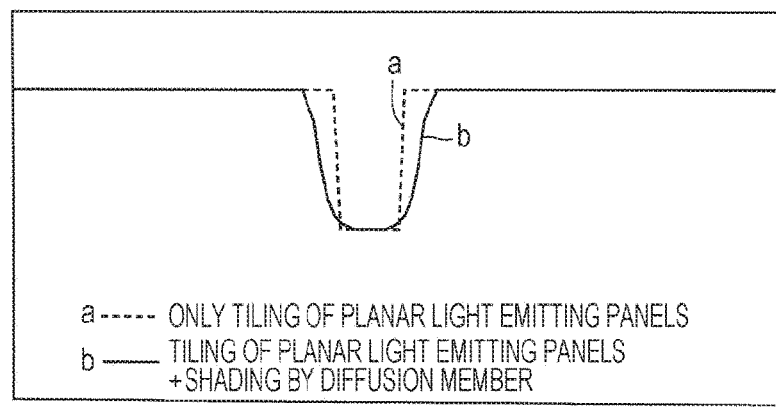
FIG. 5 is a diagram to describe a luminance profile of a planar light-emitting unit in a related art.
Figure 6:
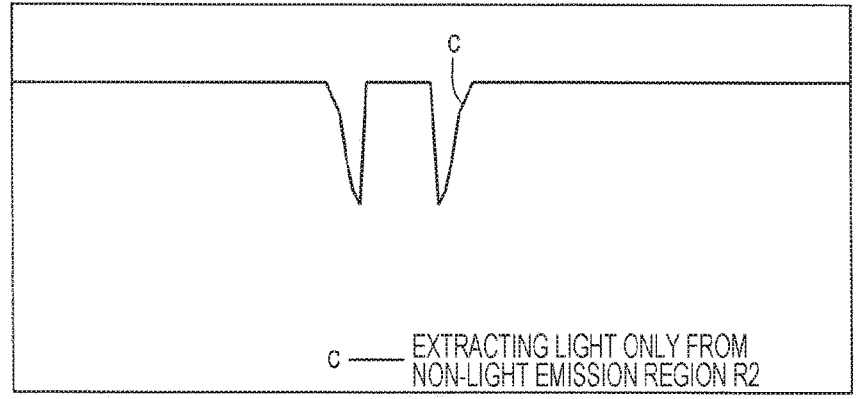
FIG. 6 is a diagram to describe a luminance profile in the case where a light guide member and a diffusion member are made to adhere to each other only at a place corresponding to a non-light emission region in the related art.
Figure 7:
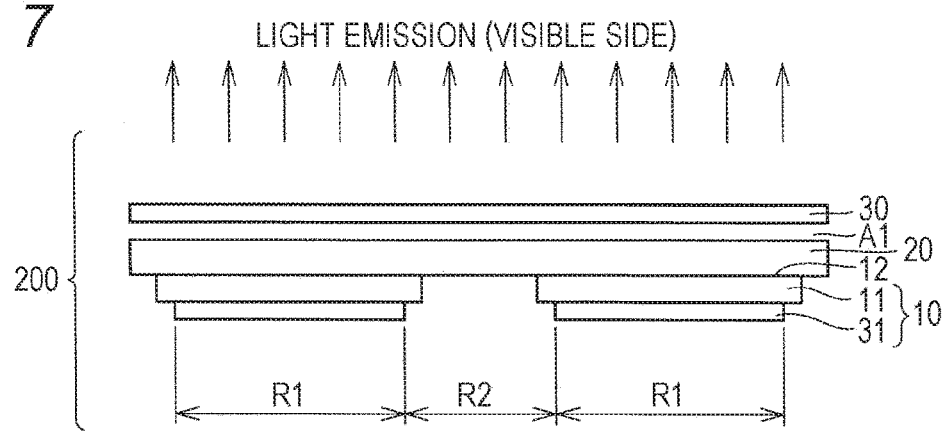
FIG. 7 is a cross-sectional view illustrating a structure of a planar light-emitting unit in the related art.
Figure 8:
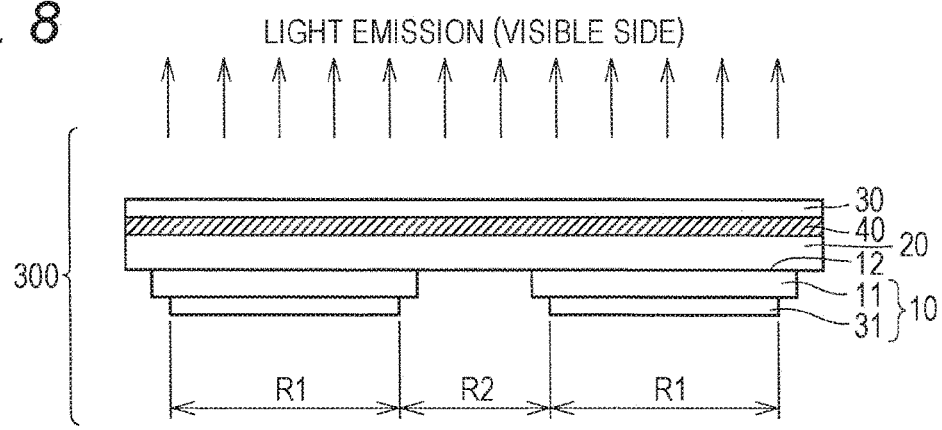
FIG. 8 is a side surface schematic view illustrating a structure of another planar light-emitting unit in the related art.

Next, a planar light-emitting unit 100 using the plurality of planar light-emitting panels 10 having the above-described structure will be described with reference to FIGS. 3 to 8. FIG. 3 is a cross-sectional view illustrating a structure of the planar light-emitting unit according to the present embodiment, FIG. 4 is an enlarged view of a region surrounded by IV in FIG. 3, FIGS. 5 and 6 are first and second diagrams to describe effects of the planar light-emitting panel, FIG. 7 is a cross-sectional view illustrating a structure of a planar light-emitting unit in the related art, and FIG. 8 is a side surface schematic view illustrating a structure of a another planar light-emitting unit in the related art.

Figure 9:
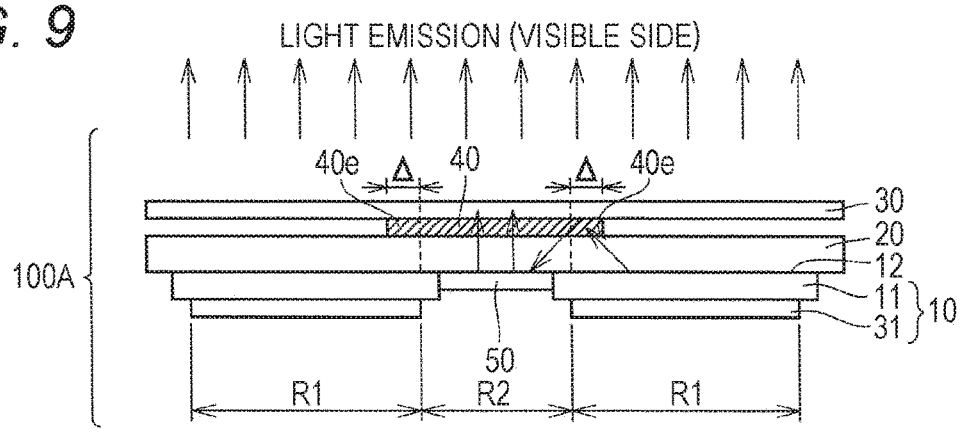
FIG. 9 is a cross-sectional view illustrating a structure of a planar light-emitting unit according to a second embodiment.

Initially, structures of a planar light-emitting unit 200 and a planar light-emitting unit 300 in the related arts will be described with reference to FIGS. 8 and 9. First, the planar light-emitting unit 200 includes: a plurality of planar light-emitting panels 10 obtained by arraying light-emitting surfaces 12 so as to be aligned in a plane shape, and adapted to emit light toward a visible side; a light guide member 20 arranged in a manner facing the light-emitting surfaces 12 of the adjacent plurality of planar light-emitting panel 10, and adapted to transmit the light emitted from the planar light-emitting panels 10; and a diffusion member 30 provided on an opposite side of the planar light-emitting panels 10 interposing the light guide member 20, and adapted to diffuse, toward the visible side, the light having passed through the light guide member 20. An arrangement interval of the planar light-emitting panels 10 is about 1 mm to 30 mm.

Thus, in the case of arraying the plurality of planar light-emitting panels 10, the non-light emission region R2 generated between the planar light-emitting panels 10 is to be a dark portion, and significantly conspicuous when viewed from the visible side. Therefore, in the case of providing the diffusion member 30 at a predetermined interval as described above, a luminance difference between the light emission region R1 and the non-light emission region R2 is reduced, and the dark portion of the non-light emission region R2 is made inconspicuous.

In this case, when a plate made of a resin in which diffusion particles are preliminarily embedded is used for the diffusion member 30, the diffusion member 30 using a diffusion sheet and the like may be pasted on the light transmissive light guide member (light transmissive member) 20 such as acryl and glass.

Further, in the planar light-emitting unit 200 illustrated in FIG. 7, an air layer Al is formed between the diffusion member 30 and the light guide member 20. In the case of this structure, the light is partly reflected and lost at an interface with the air layer when the light once passes through the air layer as a space before the light having entered the light guide member 20 reaches the diffusion member 30.

Furthermore, by emitting the light to the visible side via the diffusion member 30, a light reducing action is exerted on the diffusion member 30 (filter effect). Moreover, even in the case of providing the diffusion member 30, an amount of emitted light on the non-light emission region R2 is less compared to the light-emitting portion, and it is necessary to secure a sufficient distance (shading distance) between the planar light-emitting panel 10 and the diffusion member 30 in order to make the non-light emission region inconspicuous.

On the other hand, in the planar light-emitting unit 300 illustrated in FIG. 8, the air layer is not interposed between the diffusion member 30 and the light guide member 20, and the light transmissive light transmission member 40 contacts entire surfaces of the diffusion member 30 and the light guide member 20. In this structure also, there is an interface between the light transmission member 40 and the light guide member 20, but the light guide member 20 has a refractive index higher than the air layer. Therefore, light loss is less compared to the planar light-emitting unit 200. Furthermore, since the light having reached the diffusion member 30 is diffused inside a member of the diffusion member 30, there is little component guided and lost inside the diffusion member 30 (light extraction effect).

However, in the non-light emission region R2 and the light emission region R1, there is not much difference in a ratio of light loss. Therefore, it is necessary to secure a sufficient shading distance same as the structure of the planar light-emitting unit 200 in FIG. 7 in order to make the non-light emission region R2 inconspicuous.

Here, the structure of the planar light-emitting unit 100 according to the first embodiment illustrated in FIGS. 3 and 4 will be described. In the planar light-emitting unit 100, the light transmission member (adhesive member) 40 is provided in a manner adhering to the light guide member 20 and the diffusion member 30 in order to form a non-space region not formed with any space between the between the light guide member 20 and the diffusion member 30 in a region corresponding to the non-light emission region R2 such that a space (air layer) is formed in the region corresponding to the light emission region R1 between the light guide member 20 and the diffusion member 30. Additionally, the light transmission member 40 has a protruding region 40e extending from the non-light emission region R2 to the light emission region R1. The protruding region 40e will be described in detail later.

Preferably, the light transmission member 40 adheres to the light guide member 20 and the diffusion member 30 and is a light guide member having a refractive index n close to the light guide member 20 and the diffusion member 30 in order to avoid light loss by total reflection. Particularly, the light guide member 20 and the light transmission member 40 preferably satisfy following relations.

Here, the region corresponding to the light emission region R1 is substantially same as a region where the light emission region R1 is projected to the diffusion member 30 in a normal direction thereof, and the region corresponding to the non-light emission region R2 is substantially same as a region where the non-light emission region R2 is projected to the diffusion member 30 in a normal direction thereof.

$$[n1/n2] > \sin 60°$$

n1 is a refractive index of the light transmission member 40.
n2 is a refractive index of the light guide member 20.

In other words, preferably, $n1 > [\sqrt{3}/2] \cdot n2$ is satisfied.

Here, provided that incident light to the interface has light distribution characteristics of Lambert when light moves between two substances (substance A→substance B, respective refractive indexes nA, nB), 85% or more of the light reaches the substance B in the case where a total reflection angle is 60 degrees or more. In order to set the total reflection angle to 60 degrees or more, a ratio of the refractive indexes needs to satisfy the relation $nB/nA > \sin 60°$.

Meanwhile, the diffusion member 30 may be held by the light guide member 20 by using an optical clear adhesive tape (OCA) or the like having high transparency for the light transmission member 40, or the light transmission member 40 may be made to adhere to the light guide member 20 and the diffusion member 30 by using a member having an adhesive property for the light transmission member 40.

Considering above, as materials to be used for the light guide member 20, acryl, glass, silicon, and the like may be exemplified, and a thickness thereof may be about 10 μm to 10 mm.

Additionally, as materials to be used for the diffusion member 30, a plate in which highly diffusive fillet or the like is contained in acryl, glass, and the like, a sheet having a surface embossed (polyethylene terephthalate (PET)), a polycarbonate resin (PC), etc.), a polymer sheet having a high diffusibility, and the like are exemplified, and a thickness thereof may be about 10 μm to 3 mm.

Furthermore, as materials to be used for the light transmission member 40, the optical clear adhesive tape (OCA) and the like may be exemplified, and a thickness thereof may be about 10 μm to 300 μm.

Next, a description will be provided for the protruding region 40e of the light transmission member 40 extending from the non-light emission region R2 to the light emission region R1 with reference to FIG. 4. A setting region of the light transmission member 40 is provided on the non-light emission region R2. Consequently, two functions of a light extraction effect/a filter effect can be simultaneously obtained by one member.

In the present embodiment, in the case where the setting region of the light transmission member 40 is larger than the non-light emission region R2 and a protruding amount from the non-light emission region R2 is defined as Δ, a conditional expression (1) shown below is preferably fulfilled.

$$0 < \Delta \leq 2d \times \tan \theta \qquad (1)$$

Δ: protruding amount from non-light emission region R2 of light transmission member 40 (mm)
d: thickness of light guide member 20 (mm)
θ: total reflection critical angle between light guide member 20 and air In a region including the protruding region 40e satisfying the above expression (1), uneven distribution of high luminance having high spatial frequency components can be prevent from being generated.

A luminance profile of the planar light-emitting unit 100 having a protruding region 40e will be described with reference to FIGS. 5 and 6. FIGS. 5 and 6 are the first and second diagrams to describe effects of the planar light-emitting panel as described above.

Considering luminance distribution, in a structure formed by tiling two planar light-emitting panels 10, a luminance profile is to be a luminance profile indicated by a line a in FIG. 5. In the case of providing the diffusion member 30 in addition to the above tiling structure, a boundary between the light emission region R1 and the non-light emission region R2 is shaded, and a luminance profile is to be the one indicated by a line b in FIG. 5.

From this state, in the case where only a region having the same size as the non-light emission region R2 is made to adhere to the diffusion member 30 and guided light is extracted, a luminance profile is to be the one indicated by a line c in FIG. 6. Thus, when the adhering region is the same as the non-light emission region or a little smaller, appearance from the visible side is largely influenced because a dark portion having a high spatial frequency is generated.

Therefore, preferably, the setting region of the light transmission member (adhesive member) 40 is slightly larger than the non-light emission region. However, in the case of being too large, the guided light is extracted to the visible side before reaching the non-light emission region. Therefore, preferably, the protruding amount Δ from the non-light emission region R2 of the light transmission member 40 is within a range specified by Expression (1) above.

As described above, according to the planar light-emitting unit 100 of the present embodiment, luminance is increased by exertion of an effect of effectively extracting the light guided inside the light guide member 20 in the region provided in the non-light emission region R2 in which the light transmission member (adhesive member) 40 exists. On the other hand, in the region formed with the space (air layer), the above-described filter effect is exerted, and luminance is decreased by receiving the light reducing action. Thus, the one diffusion member 30 can be made to have two effects of "filter (light reducing) effect" and "light extraction effect".

Consequently, the luminance difference generated between the light emission region R1 and the non-light emission region R2 is reduced, and luminance unevenness in the planar light-emitting unit 100 can be made inconspicuous. Furthermore, there is no need to increase the thickness of the planar light-emitting unit 100 because the only requirement is to provide the light transmission member (adhesive member) 40.

Moreover, the planar light-emitting unit 100 may have a curved shape by using a flexible member for the constituent members of the planar light-emitting unit 100.

Additionally, in the light transmission member (adhesive member) 40, the luminance difference generated between the light emission region R1 and the non-light emission region R2 can be reduced by including the protruding region 40e protruding from the non-light emission region R2 of the light transmission member 40 and making the protruding amount Δ of the protruding region 40e satisfy the above Expression (1).

Second Embodiment: Planar Light-Emitting Unit 100A

Next, a planar light-emitting unit 100A according to a second embodiment will be described with reference to FIG. 9. FIG. 9 is a cross-sectional view illustrating a structure of the planar light-emitting unit 100A according to the present embodiment.

A basic structure of the planar light-emitting unit 100A according to the present embodiment is the same as a planar light-emitting unit 100 according to a first embodiment described above, and is different in that a reflection member 50 to reflect light toward a visible side is provided in a non-light emission region R2 of a light guide member 20 on a side where a planar light-emitting panel 10 is located. The reflection member 50 may be a mirror surface reflection member, but using a diffusion member is more preferable.

As materials to be used for the reflection member 50, a high polymer material such as polyethylene terephthalate (PET), metals such as Al and Ag, and the like may be exemplified, and preferably, a thickness thereof may be about 10 μm to 1 mm and reflectance thereof is 70% or more.

According to the planar light-emitting unit 100A in the present embodiment, functions and effect same as the first embodiment can be obtained. Furthermore, by providing the reflection member 50, reflection light from a surface of the light guide member 20 and from the diffusion member 30 is guided to a non-light emission region, and luminance on the non-light emission region R2 can be further increased, and a luminance difference generated between a light emission region R1 and the non-light emission region R2 can be further reduced.

Third Embodiment: Planar Light-Emitting Unit 100B

Figure 10:
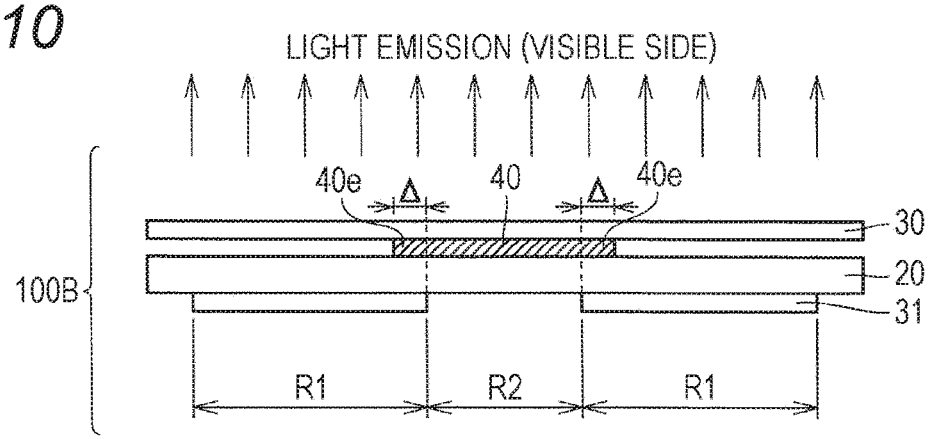
FIG. 10 is a cross-sectional view illustrating a structure of a planar light-emitting unit according to a third embodiment.

Next, a planar light-emitting unit 100B according to a third embodiment will be described with reference to FIG. 10. FIG. 10 is a cross-sectional view illustrating a structure of the planar light-emitting unit 100B according to the present embodiment.

A basic structure of the planar light-emitting unit 100B according to the present embodiment is the same as a planar light-emitting unit 100 according to a first embodiment described above, and is different in that a light-emitting surface 12 of a planar light-emitting panel 10 is arranged in a manner contacting a light guide member 20. Preferably, the light guide member 20 and the planar light-emitting panel 10 are made to adhere to each other by using oil, a light transmissive double-stick tape, or the like so as not to allow air enter therebetween.

According to the planar light-emitting unit 100B in the present embodiment, functions and effect same as the first embodiment can be obtained. Furthermore, since the light-emitting surface 12 of the planar light-emitting panel 10 is arranged in a manner contacting the light guide member 20, light can be guided from the planar light-emitting panel 10 to the light guide member 20 with little light loss.

Fourth Embodiment: Planar Light-Emitting Unit 100C

Figure 11:
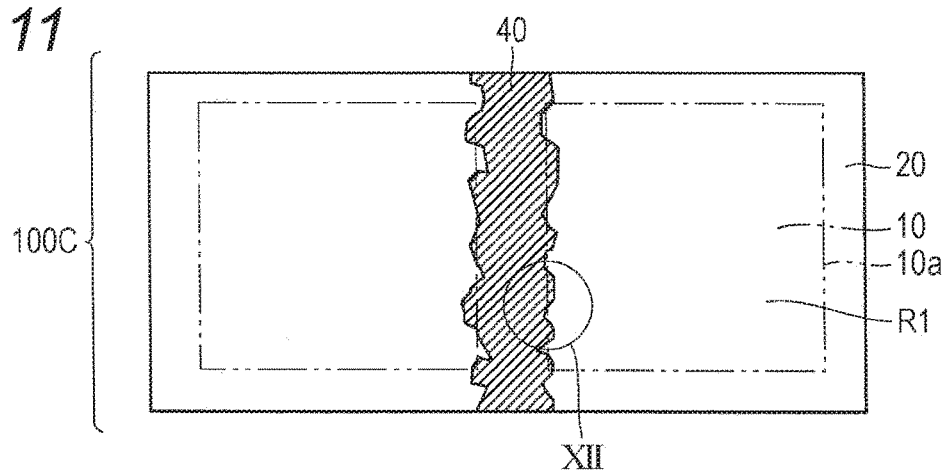
FIG. 11 is a plan view illustrating a structure of a planar light-emitting unit according to a fourth embodiment.
Figure 12:
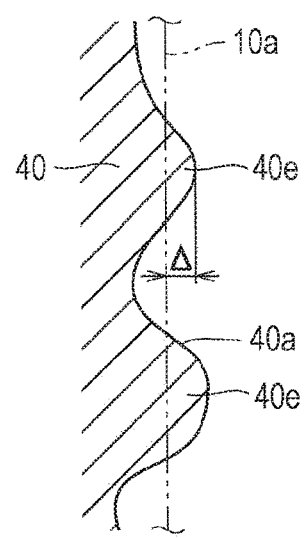
FIG. 12 is an enlarged view of a region surrounded by XII in FIG. 11.

Next, a planar light-emitting unit 100C according to a fourth embodiment will be described with reference to FIGS. 11 and 12. FIG. 11 is a plan view illustrating a structure of the planar light-emitting unit 100C according to the present embodiment, and FIG. 12 is an enlarged view of a region surrounded by XII in FIG. 11.

A basic structure of the planar light-emitting unit 100C according to the embodiment is the same as a planar light-emitting unit 100 according to a first embodiment described above, and is different in that a light transmission member 40 has an end portion including a region 40a that passes across a boundary 10a between a light emission region R1 and a non-light emission region R2.

A light source that is the planar light-emitting panel 10 (planar light-emitting portion 31) is generally shaped in a polygon such as a square or a rectangle or in a round shape, and the boundary 10a between the light emission region R1 and the non-light emission region R2 is formed in a line segment. In the present embodiment, a boundary between a region provided with a light transmission member 40 and a region provided with an air layer is assumed to be generated along the boundary 10a between the light emission region R1 and the non-light emission region R2. At the boundary, it is presumed that a luminance difference easily becomes conspicuous because optical characteristics rapidly change at the boundary.

Bright and dark portions having two-dimensional waveforms can be more hardly recognized by human eyes than regular bright and dark portions. Therefore, as illustrated in FIGS. 11 and 12 of the present embodiment, existence of the boundary 10a between the light emission region R1 and the non-light emission region R2 can be made less conspicuous compared to respective embodiments described above by providing the end portion of the light transmission member 40 with the wavelike region 40a passing across the boundary 10a between the light emission region R1 and the non-light emission region R2 a plurality of times.

A protruding amount Δ of a protruding region 40e, which protrudes to the non-light emission region R2 from the boundary 10a of the light transmission member 40, fulfills a condition of Expression (1) described above.

According to the planar light-emitting unit 100C in the present embodiment, functions and effect same as the first embodiment can be obtained. Furthermore, since the light transmission member 40 has the end portion provided with the wavelike region 40a passing across the boundary 10a between the light emission region R1 and the non-light emission region R2, a luminance difference generated between the light emission region R1 and the non-light emission region R2 can be made more inconspicuous.

Figure 13:
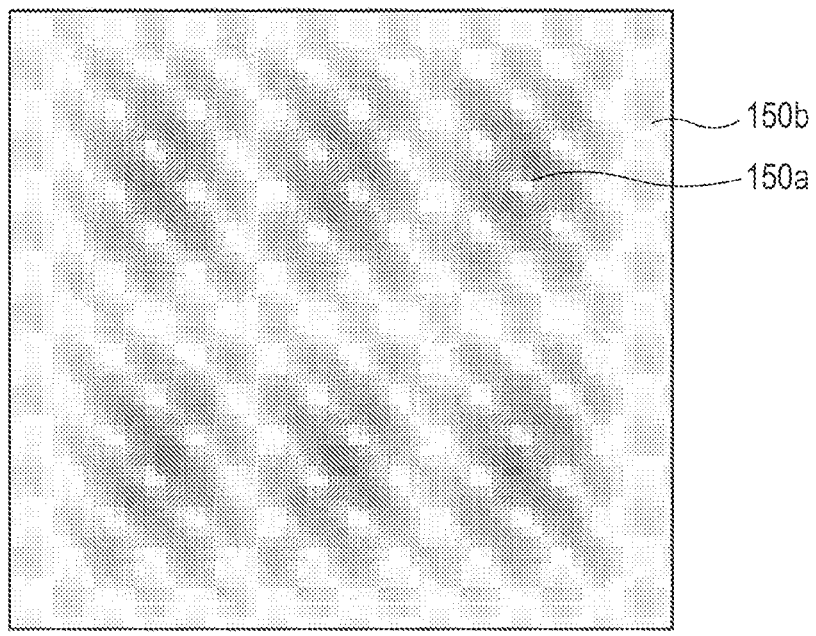
FIG. 13 is a schematic view illustrating an adjustment pattern of a transmitted light amount.

Meanwhile, according to the respective embodiments describe above, as illustrated in FIG. 13, a luminance difference between the light emission region R1 and the non-light emission region R2 can be further reduced by increasing or decreasing reflectance or transmissivity in accordance with a position on the diffusion member 30 or the light guide member 20. In FIG. 13, transmitted light amount adjustment patterns 150a, 150b are formed. A region of the transmitted light amount 150a (region illustrated in deepest color) is a region that has a minimum transmitted light amount), and a region of the transmitted light amount adjustment pattern 150b (illustrated in most pale color) is a region that has a largest transmitted light amount).

Furthermore, according to the respective embodiments described above, the case of using two planar light-emitting panels 10 (planar light-emitting portions 31) has been described. However, the number of planar light-emitting panels 10 is not limited to two, and three or more planar light-emitting panels 10 may also be arrayed so as to be aligned in a plane shape. In this case, as for the non-light emission region R2, a region generated between the adjacent planar light-emitting panels 10 constitutes the non-light emission region R2.

According to the respective embodiments described above, adopted is the structure in which the light transmission member (adhesive member) 40 is provided in a manner adhering the light guide member 20 and the diffusion member 30 in order to form a space (air layer) in the region corresponding to the light emission region R1 between the light guide member 20 and the diffusion member 30 and form a non-space region not formed with any space between the between the light guide member 20 and the diffusion member 30 in a region corresponding to the non-light emission region R2. However, the structure is not limited thereto.

For example, in the region corresponding to the non-light emission region R2, the non-space region not formed with any space may be formed by making the light guide member 20 and the diffusion member 30 adhere to each other by utilizing self-adsorption force between the light guide member 20 and the diffusion member 30. In this case, a region directly contacting the light guide member 20 and the diffusion member 30 protrudes in the protruding region 40e.

Furthermore, according to the respective embodiments described above, the structure in which the planar light-emitting panel 10 (planar light-emitting portion 31) adheres to the light guide member 20 is illustrated, but clearance may also be provided between the planar light-emitting panel 10 (planar light-emitting portion 31) and the light guide member 20 within a range in which light totally reflected and transmitted into the light guide member 20 is not generated.

Example

Figure 14:
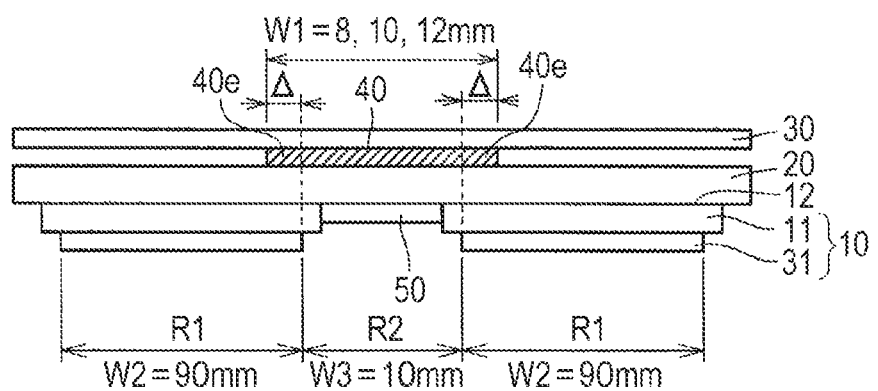
FIG. 14 is a cross-sectional view illustrating a structure of a planar light-emitting unit in an example.

In the following, a description will be provided for a geometric optical simulation that has been performed for change observed in an illuminance profile (verification of effects) in the case of changing the protruding amount Δ of the protruding region 40e of the light transmission member (adhesive member) 40. FIG. 14 illustrates a cross-sectional view of a planar light-emitting unit model used in the geometric optical simulation. A structure of the planar light-emitting unit model was the same as the planar light-emitting unit 100A in the above-described second embodiment.

In the planar light-emitting unit in which two square planar light-emitting panels 10 each having a side of 90 mm were arranged at an interval of 10 mm and the light-emitting surface sides of the planar light-emitting panels 10 were made to adhere to the light guide member 20 having a thickness of 5 mm(d), the diffusion member 30 was arranged on a surface of the light guide member 20 located on an opposite side of the planar light-emitting panels 10, and the light guide member 20 and the diffusion member 30 were made to adhere to each other by using the light transmission member (adhesive member) 40.

Assuming that light distribution of the planar light-emitting panel 10 was Lambert, and the reflection member 50 was arranged in the non-light emission region R2 between the planar light-emitting panels 10. Acryl (refractive index n: 1.51) was used for the light guide member 20, and at this point, a total reflection critical angle θ between the light guide member 20 and air was θ≈41.5[°], 2d tan θ≈8.8 mm. Under such preconditions, the geometric optical simulation was performed while the light guide member 20 was made to adhere to the diffusion member 30 on the non-light emission region R2.

In the geometric optical simulation, an adhering width of the light transmission member (adhesive member) 40 was set to 8 mm, 10 mm, and 12 mm, more specifically, the protruding amount Δ was set to −1 mm, 0 mm, and 1 mm, and the geometric optical simulation was performed to study how a cross-sectional luminance profile is changed in respective cases. The results are shown in FIG. 15.

Compared to the case where the light transmission member (adhesive member) 40 is not provided, a luminance at a center of the non-light emission region R2 is approximate to a luminance of the light emission region R1 in all of the cases in the structure provided with the light transmission member (adhesive member) 40, and it was observed that a luminance difference (luminance unevenness) between the non-light emission region R2 and the light emission region R1 is improved.

Furthermore, focusing on the luminance profile in the non-light emission region R2, in the case where the protruding amount Δ was wider than the non-light emission region (1 mm), a smooth cross-section was observed. On the other hand, when the protruding amount Δ was the same position as the non-light emission region R2 (0 mm) or the protruding amount Δ was minus (−1 mm), a dark portion having a high spatial frequency was generated in the luminance profile. The dark portion having the high spatial frequency can be easily recognized by a human. Furthermore, in the case of additionally providing a diffusion member or the like in addition to this structure, correction may be difficult compared to a dark portion having a low spatial frequency. Therefore, preferably, the setting region of the light transmission member (adhesive member) 40 protrudes to the non-light emission region in order to prevent the dark portion having the high spatial frequency from being generated.

Meanwhile, compared to a structure not provided with the light transmission member (adhesive member) 40, luminance unevenness was more improved in the case of providing the light transmission member (adhesive member) 40 as illustrated in FIG. 15 even though the protruding amount Δ was at the same position as the non-light emission region R2 or the protruding amount Δ was minus.

(Upper Limit of Protruding Amount Δ)

To verify an upper limit of the protruding amount Δ, appearance evaluation was made in a planar light-emitting unit sample of an actual machine. A structure of the planar light-emitting unit sample in which evaluation of the actual machine was made is illustrated in FIG. 16. Two square planar light-emitting panels 10 each having a side of 90 mm were pasted to a transparent silicon sheet (light guide member 20) having the thickness of 5 mm by using a transparent bond 60, and the diffusion member 30 was arranged on an opposite side of the planar light-emitting panels 10. As the diffusion member 30, a special film printed with white ink having different transmissivity between the light emission region R1 and the non-light emission region R2 was used.

The diffusion member 30 using this special film and the light guide member 20 were made to adhere to each other in a predetermined width by utilizing self-adsorption force thereof only on the non-light emission region R2. Experiments were performed by setting the adhering width to 10 mm, 20 mm, 24 mm, and 28 mm, more specifically, by setting the protruding amount Δ to 0 mm, 5 mm, 7 mm, and 9 mm, and evaluation was made respectively. Appearance evaluation results in the planar light-emitting unit sample of the actual machine are illustrated in FIG. 17. Furthermore, evaluation based on the geometric optical simulation is illustrated in parallel. Evaluation was performed by subjective evaluation based on observation with naked eyes, and improvement levels of appearance in the structure not having the adhesive member are indicated as next: "Evaluation A: large improvement observed"; "Evaluation B: improvement observed", and "Evaluation C: no change".

On the other hand, the planar light-emitting panel having light distribution more tilted to a horizontal surface side than Lambertian was used in the planar light-emitting unit sample of the real machine. Furthermore, a reflection surface of the planar light-emitting panel had mirror surface reflection characteristics. Therefore, a light amount guided inside the light guide member 20 was large, and presumably, a large amount of light was supplied to the non-light emission region R2.

As a result, when the protruding amount Δ was large to a certain extent, such as 5 mm 7 mm, appearance was relatively good. However, when the protruding amount Δ was 9 mm, a center of the non-light emission region seemed slightly dark. The reason might be that the amount of the guided light reaching the non-light emission region was reduced.

In the planar light-emitting unit sample of the actual machine, the refractive index n of the silicon sheet used for the light guide member 20 was about 1.5, and the total reflection critical angle between the light guide member 20 and air was θ≈41[°], 2d tan θ≈8.8 mm in this case. In consideration of the evaluation results on the planar light-emitting unit sample of actual machine, when the protruding amount Δ exceeded at least 2d tan θ, it can be considered that light is extracted on the light emission region R1 and luminance on the non-light emission region R2 is not increased.

While illustration devices according to the respective embodiments of the present invention have been described as above, it should be understood that the embodiments disclosed herein are illustrative and non-limitative in every respect. Therefore, the scope of the present invention is defined by the scope of the claims, and intended to include any modifications within the scope and meaning equivalent to the scope of the claims.

REFERENCE SIGNS LIST

10 Planar light-emitting panel
11 Transparent substrate
12 Light-emitting surface (surface)
13 Rear surface
14 Positive pole (anode)
15 Organic layer
16 Negative pole (cathode)
17 Sealing member
18 Insulation layer
19 Back surface
20 Light guide member
21, 22 Electrode portion
30 Diffusion member
31 planar light-emitting portion
Light transmission member
40e Protruding region
50 Reflection member
100, 100A, 100B, 100C, 100D Planar light-emitting unit

The invention claimed is:
1. A planar light-emitting unit comprising:
a plurality of surface light-emitting portions obtained by arraying light-emitting surfaces so as to be aligned in a plane shape, and configured to emit light toward a visible side;
a light guide member arranged in a manner facing the light-emitting surfaces of the plurality of surface light-emitting portions adjacent to each other and configured to transmit light emitted from the surface light-emitting portions; and
a diffusion member provided on an opposite side of the surface light-emitting portions interposing the light guide member, and configured to diffuse, toward a visible side, the light having passed through the light guide member, wherein
each of the plurality of surface light-emitting portions includes a light emission region configured to emit light and a non-light emission region located on an outer periphery of the light emission region and configured not to emit light,
a non-space region not formed with a space between the light guide member and the diffusion member is provided in a region corresponding to the non-light emission region such that a space is formed in a region corresponding to the light emission region between the light guide member and the diffusion member, and
the non-space region includes a protruding region extending to the light emission region from the non-light emission region, and in the case of defining, as Δ, a protruding amount from the non-light emission region, a following conditional expression (1) is fulfilled:

$$0 < \Delta \leq 2d \times \tan \theta \qquad (1)$$

Δ: protruding amount from non-light emission region of the non-space region (mm)
d: thickness of light guide member (mm)
θ: total reflection critical angle between light guide member and air.

2. The planar light-emitting unit according to claim 1, further comprising a light transmission member, wherein the light transmission member is provided in a manner adhering to the light guide member and the diffusion member in the non-space region.

3. The planar light-emitting unit according to claim 2, wherein the light transmission member has an adhesive property, and the light transmission member adheres to the light guide member and the diffusion member.

4. The planar light-emitting unit according to claim 1, wherein a reflection member configured to emit light toward a visible side is further provided in the non-light emission region on a side of the light guide member where the surface light-emitting portion is located.

5. The planar light-emitting unit according to claim 2, wherein the surface light-emitting portion includes a transparent substrate on the visible side, and the transparent substrate contacts the light guide member.

6. The planar light-emitting unit according to claim 5, wherein the surface light-emitting portion, the light guide member, the diffusion member, the light transmission member, and the transparent substrate respectively have flexibility, and can be curved as an entire body.

7. The planar light-emitting unit according to claim 2, wherein the surface light-emitting portion contacts the light guide member.

8. The planar light-emitting unit according to claim 7, wherein the surface light-emitting portion, the light guide member, the diffusion member, and the light transmission member respectively have flexibility, and can be curved as an entire body.

9. The planar light-emitting unit according to claim 1, wherein the non-space region has an end portion including a region passing across a boundary between the light emission region and the non-light emission region.

10. The planar light-emitting unit according to claim 1, wherein the diffusion member includes a region having different transmissivity or reflectance.

11. The planar light-emitting unit according to claim 2, wherein a reflection member configured to emit light toward a visible side is further provided in the non-light emission region on a side of the light guide member where the surface light-emitting portion is located.

12. The planar light-emitting unit according to claim 2, wherein the non-space region has an end portion including a region passing across a boundary between the light emission region and the non-light emission region.

13. The planar light-emitting unit according to claim 2, wherein the diffusion member includes a region having different transmissivity or reflectance.

14. The planar light-emitting unit according to claim 3, wherein a reflection member configured to emit light toward a visible side is further provided in the non-light emission region on a side of the light guide member where the surface light-emitting portion is located.

15. The planar light-emitting unit according to claim 3, wherein the non-space region has an end portion including a region passing across a boundary between the light emission region and the non-light emission region.

16. The planar light-emitting unit according to claim 3, wherein the diffusion member includes a region having different transmissivity or reflectance.

17. The planar light-emitting unit according to claim 4, wherein the non-space region has an end portion including a region passing across a boundary between the light emission region and the non-light emission region.

18. The planar light-emitting unit according to claim 4, wherein the diffusion member includes a region having different transmissivity or reflectance.

19. The planar light-emitting unit according to claim 5, wherein the non-space region has an end portion including a region passing across a boundary between the light emission region and the non-light emission region.

20. The planar light-emitting unit according to claim 5, wherein the diffusion member includes a region having different transmissivity or reflectance.

* * * * *